(12) United States Patent
Al Ammar (10) Patent No.: US 9,336,926 B2
(45) Date of Patent: May 10, 2016

(54) ELONGATED, DUCTILE, RIDGED, COIL-RETAINING MEMBER

(71) Applicant: Omar Al Ammar, Riyadh (SA)

(72) Inventor: Omar Al Ammar, Riyadh (SA)

( * ) Notice: Subject to any disclaimer, the term of this patent is extended or adjusted under 35 U.S.C. 154(b) by 9 days.

(21) Appl. No.: 14/321,277

(22) Filed: Jul. 1, 2014

(65) Prior Publication Data

US 2016/0005507 A1 Jan. 7, 2016

(51) Int. Cl.
| | | |
|---|---|---|
| *H01R 43/048* | (2006.01) | |
| *H01B 7/04* | (2006.01) | |
| *H05K 9/00* | (2006.01) | |
| *H01B 13/08* | (2006.01) | |

(52) U.S. Cl.
CPC ............... *H01B 7/04* (2013.01); *H01B 13/08* (2013.01); *H05K 9/00* (2013.01)

(58) Field of Classification Search
CPC .................................................. H01R 1/1033
USPC ....................................................... 174/135
See application file for complete search history.

(56) References Cited

U.S. PATENT DOCUMENTS

| | | | | |
|---|---|---|---|---|
| 5,577,932 A | * | 11/1996 | Palmer ............ | H05K 5/0247 206/702 |
| 6,534,713 B2 | * | 3/2003 | Kafer ............ | B60R 16/0215 174/72 A |
| 6,674,005 B2 | * | 1/2004 | Yagi ............... | H01R 9/032 138/123 |
| 7,238,889 B2 | | 7/2007 | Rivera | |
| 8,399,769 B2 | * | 3/2013 | Doll ............... | H04R 1/1033 174/110 R |
| 8,615,849 B2 | | 12/2013 | Rothbaum et al. | |
| 8,908,898 B2 | * | 12/2014 | Im .................. | H04R 1/1033 174/70 R |
| 2007/0034400 A1 | * | 2/2007 | Rivera ............ | B65H 75/36 174/138 G |

FOREIGN PATENT DOCUMENTS

FR     2554985     *  5/1985

OTHER PUBLICATIONS

Cory Bohon, "How to Manage Your Apple Cables and Keep Them Tangle-free", Maclife.com, Mar. 9, 2011, http://www.maclife.com/article/howtos/how_keep_your_apple_device_cables_tanglefree#slide-9.

* cited by examiner

*Primary Examiner* — Chau N Nguyen
(74) *Attorney, Agent, or Firm* — Oblon, McClelland, Maier & Neustadt, L.L.P.

(57) ABSTRACT

An insulated cable that includes conductors has a first interface at one end that is configured to detachably attach to a first electronic device and a second interface at the other end that is configured to detachably attach to a second electronic device so that the first electronic device and the second electronic device are interconnected. An elongated, ductile, ridged, coil-retaining member is attached at the other end of the insulated cable, and it is configured to hold the electric signal cable in a wound state when the elongated, ductile, ridged, coil-retaining member is wrapped on itself such that ridges on a surface of the elongated, ductile, ridged, coil-retaining member are received by valleys on the surface of the elongated, ductile, ridged, coil-retaining member in order to limit a translatory motion of the elongated, ductile, ridged, coil-retaining member when it is subjected to a tensile stress.

19 Claims, 7 Drawing Sheets

ELONGATED, DUCTILE, RIDGED, COIL-RETAINING MEMBER

GRANT OF NON-EXCLUSIVE RIGHT

This application was prepared with financial support from the Saudia Arabian Cultural Mission, and in consideration therefore the present inventor has granted, the Kingdom of Saudi Arabia a non-exclusive right to practice the present invention.

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Electronic devices have become an indispensable part of daily life for the average person in the developed world. With each electronic device that a person obtains, there is most likely an associated power cord or charging cable. Maintaining these power cords and charging cables in an organized fashion while they are attached to their associated electronic devices or while they are being stored can be a challenge.

SUMMARY

An electric signal cable is composed of an insulated cable that contains conductors. The cable is configured to interconnect a first electronic device and a second electronic device via interfaces at each end of the cable that detachably attach to the electronic devices. An elongated, ductile, ridged, coil-retaining member is disposed at one end of the electric signal cable that is configured to hold the cable in a wound state. Ridges on the surface of the elongated, ductile, ridged, coil-retaining member are received by valleys on the surface of the elongated, ductile, ridged, coil-retaining member to limit translatory motion of the elongated, ductile, ridged, coil-retaining member when subjected to a tensile stress.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

In view of the above, it is desirable to develop an apparatus for retaining electric signal cables in an organized fashion. Referring now to the drawings, wherein like reference numerals designate identical or corresponding parts throughout the several views, the following description relates to an apparatus and associated methodology for maintaining an electric signal cable in a wound state with an elongated, ductile, ridged, coil-retaining member. Further, as used herein, the words "a," "an" and the like generally carry a meaning of "one or more," unless stated otherwise. The drawings are generally drawn to scale unless specified otherwise or illustrating schematic structures or flowcharts.

Figure 1:
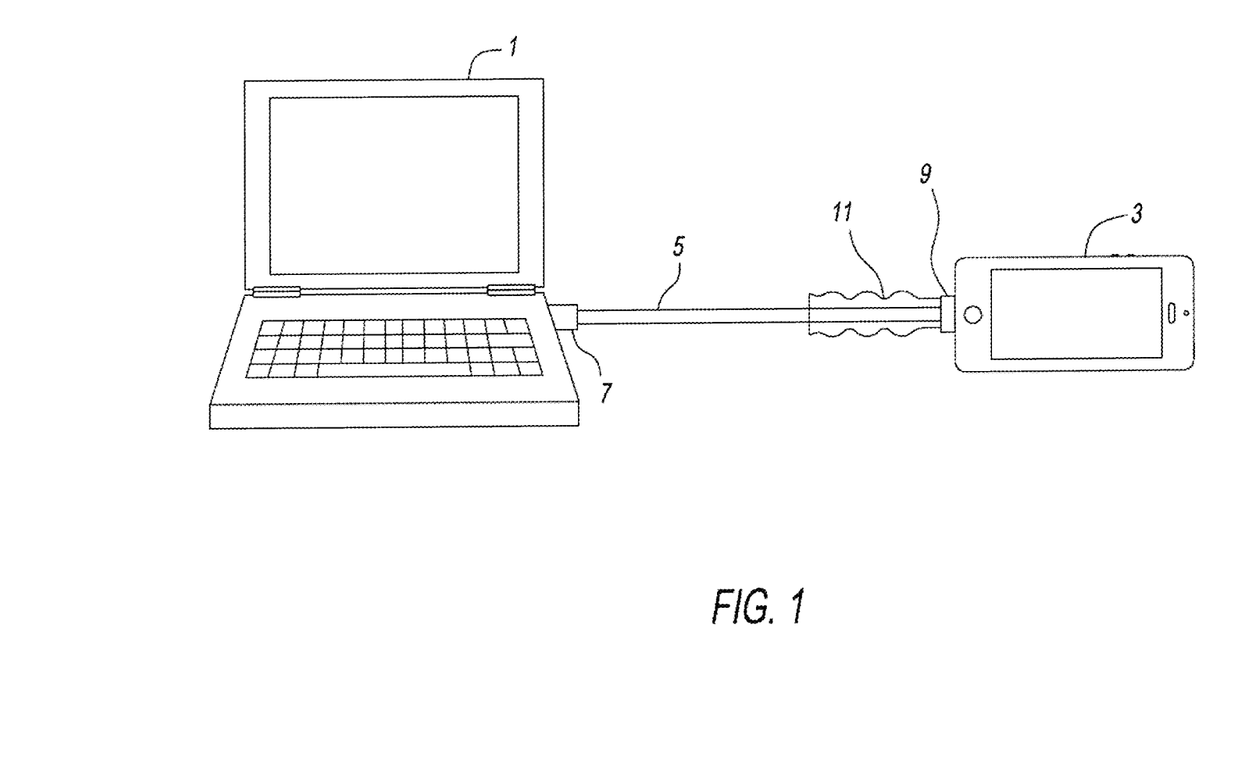
FIG. 1 is an exemplary overview illustration of an electric signal cable with an elongated, ductile, ridged, coil-retaining member.

FIG. 1 is an overview illustration of an electric signal cable 5, which in this embodiment is a mobile device charging cable, although other types of electric signal cables may be used that include Category 5 (Cat 5) cables, extension cords, small electric appliance power cords, and the like. At a detachably attached first end 7, the cable is attached at to a first electronic device 1, which in this implementation is a computer. According to other implementations, this first electronic device 1 may be an electronics docking station, surge protector, a wall-mounted electric socket, and the like. At a detachably attached second end 9, the cable is attached to a second electronic device 3, which in this aspect is a mobile device such as a cell phone. According to other aspects, the second electronic device 3 may be a laptop, music player, personal digital assistant (PDA), tablet, computer, or small electric appliance. An elongated, ductile, ridged, coil-retaining member 11 is integrally attached at the second end 9 of the electric signal cable 5 according to one implementation.

Figure 2:
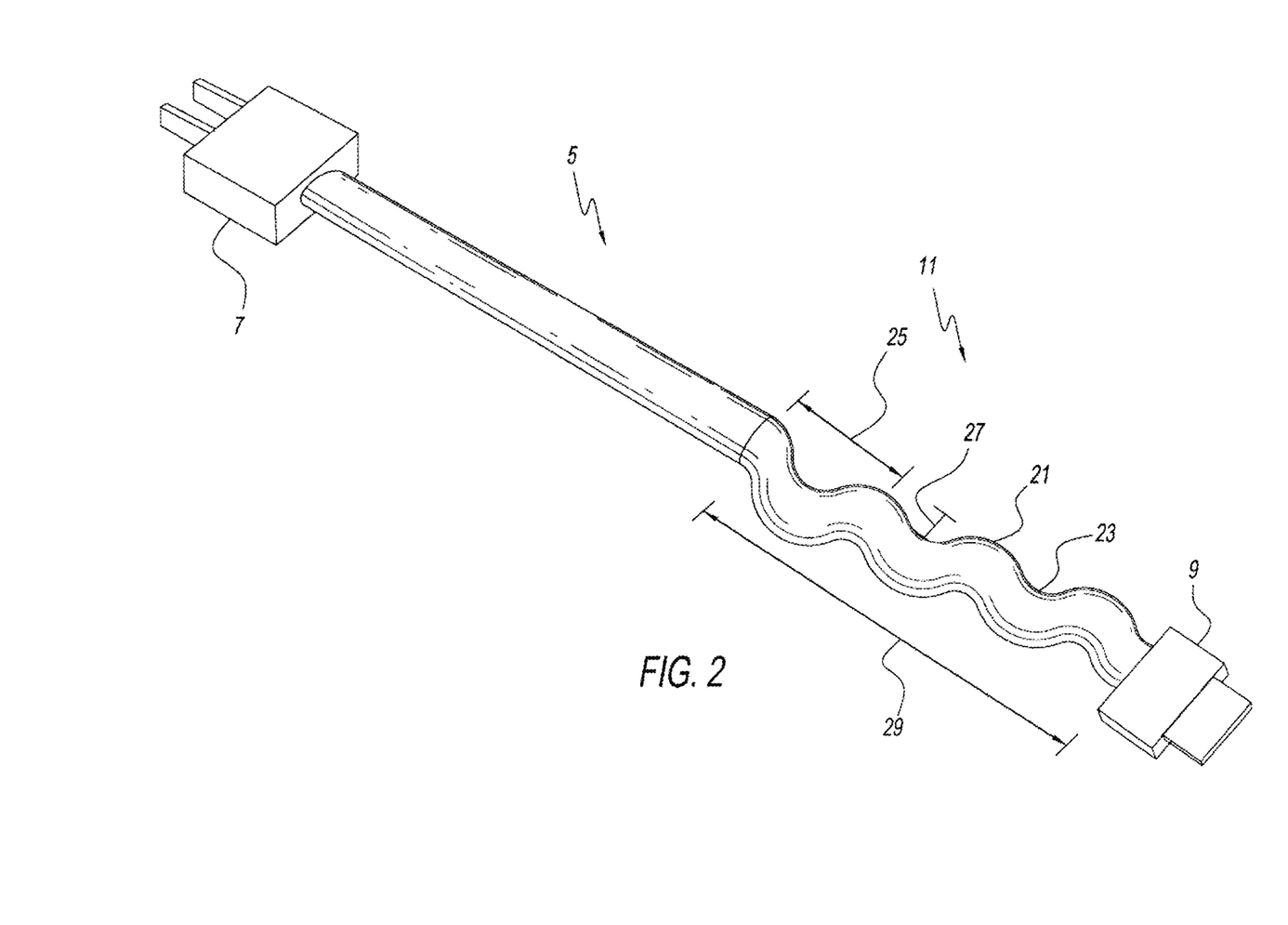
FIG. 2 is an exemplary illustration of an electric signal cable with an elongated, ductile, ridged, coil-retaining member in an unwound state.

FIG. 2 is an exemplary illustration of an electric signal cable 5 with an elongated, ductile, ridged, coil-retaining member 11 in an unwound state. In this example, the elongated, ductile, ridged, coil-retaining member 11 is integrally attached at the second end 9 of the electric signal cable 5. The elongated, ductile, ridged, coil-retaining member 11 is composed of a malleable material that is able to be bent into a shape by a user and then retains that shape until it is repositioned. A non-limiting list of suitable example materials includes metals such as aluminum, iron, or gold; metallic paper; plastic; smart metallic alloys; and malleable plastics such as malleable polymers, thermoplastics, and amorphous solids.

Figure 3:
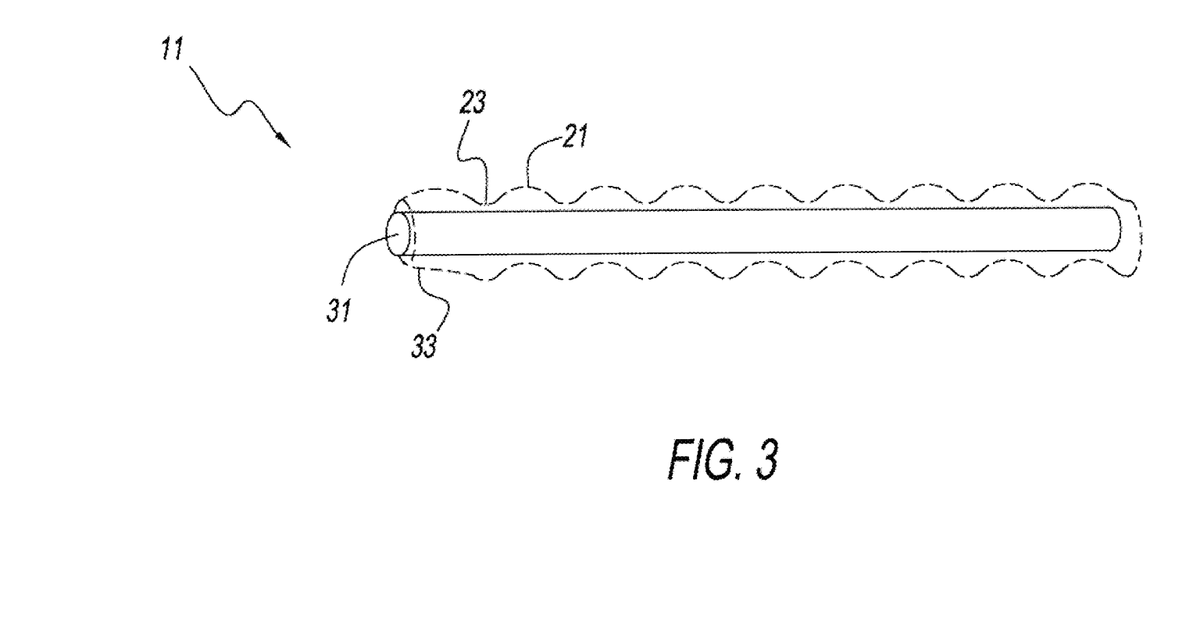
FIG. 3 is an exemplary illustration of a cross-section of an elongated, ductile, ridged, coil-retaining member.

FIG. 3 is an exemplary illustration of a cross-section of the elongated, ductile, ridged, coil-retaining member 11. According to this embodiment, the elongated, ductile, ridged, coil-retaining member 11 is composed of two separate materials. A metallic material with ductile properties 31 is able to be bent into a shape by a user and retains its shape until it is repositioned. A non-limiting list of suitable example materials includes metals such as aluminum, iron, or gold. This ductile metallic material is coated with a plastic coating 33 such as polyurethane, thermoplastics, and other malleable polymers. This plastic coating may be molded into a predetermined pattern of ridges 21 and valleys 23.

Referring back to FIG. 2, the length 29 that the elongated, ductile, ridged, coil-retaining member 11 extends from the second end of the cable 9 may vary based on the dimensions of the cable but is of a length that is an integer multiple of the diameter of the insulated cable times a number of loops of coiled cable that the elongated, ductile, ridged, coil-retaining member 11 and is within the range of 2 cm (centimeters) to 5 cm, with any length therebetween. In an implementation where the electric signal cable 5 is a cell phone charging cable with a diameter of 3 mm (millimeters), the length 29 of the elongated, ductile, ridged, coil-retaining member 11 may be 2.1 cm, 2.4 cm, 2.7 cm, 3.0 cm, 3.3 cm, 3.6 cm, 3.9 cm, 4.2 cm, 4.5 cm, or 4.8 cm. In an implementation where the dimensions of the electric signal cable 5 are larger than a cell phone charging cable, such as in the case of a computer power cord that is 5 mm in diameter, the length 29 of the elongated, ductile, ridged, coil-retaining member 11 may be 2.0 cm, 2.5 cm, 3 cm, 3.5 cm, 4 cm, 4.5 cm, or 5 cm.

As shown in FIG. 2, a ridge 21 and a valley 23 are formed on the surface of the elongated, ductile, ridged, coil-retaining member 11. In some embodiments, there are a plurality of ridges 21 and valleys 23 that are arranged in a predetermined, repeating pattern. As such, the terms referring to one or more than one of the ridges 21 and valleys 23 can be used interchangeably. According to one implementation, the pattern is a sinusoid is of the form y(x)=A sin(2πfx), where A is the amplitude 27 that specifies the height of the ridges 21 and depth of the valleys 23. The x specifies a distance from the second end of the cable. The frequency f of the sinusoidal pattern translates to a corresponding period 25 of the sinusoid according to the equation, τ=1/f, where τ represents the period 25 of the sinusoid. One period 25 corresponds to one ridge 21 and an adjacent valley 23 on the surface of the elongated, ductile, ridged, coil-retaining member 11. The amplitude 27 and period 25 of the sinusoid may vary based on the dimensions of the electric signal cable 5. The amplitude 27 of the sinusoid may be any value in the range of 0.1 mm to 10 mm and is designed to be 50% of the radius of the cable. The frequency of the sinusoid may be any value in the range of 0.1 to 10 cycles per millimeter, which corresponds to a period 25 in the range of 10 mm to 0.1 mm.

According to another aspect, the predetermined, repeating pattern of the ridges 21 and valleys 23 arranged on the surface of the elongated, ductile, ridged, coil-retaining member 11 may take the shape of a saw tooth wave of the form $$y(x) = A\frac{x}{\tau} - A\left\lfloor \frac{x}{\tau} \right\rfloor$$

where A is the amplitude 27 that specifies the height of the ridges 21 and depth of the valleys 23. The x specifies a distance from the second end of the cable. The τ represents the period 25 of the saw tooth function. One period 25 corresponds to one ridge 21 and an adjacent valley 23 on the surface of the elongated, ductile, ridged, coil-retaining member 11. The amplitude 27 and period 25 of the sinusoid may vary based on the dimensions of the electric signal cable 5. The amplitude 27 of the sinusoid may be any value in the range of 0.1 mm to 10 mm and is designed to be 50% of the radius of the cable. The frequency of the sinusoid may be any value in the range of 0.1 to 10 cycles per millimeter, which corresponds to a period 25 in the range of 10 mm to 0.1 mm.

According to another aspect, the predetermined, repeating pattern of the ridges 21 and valleys 23 arranged on the surface of the elongated, ductile, ridged, coil-retaining member 11 may take the shape of a triangle wave of the form $$y(x) = \left| A\frac{x}{\tau} - A\left\lfloor \frac{x}{\tau} \right\rfloor \right|$$

where A is the amplitude 27 that specifies the height of the ridges 21 and depth of the valleys 23. The x specifies a distance from the second end of the cable. The r represents the period 25 of the triangle wave function. One period 25 corresponds to one ridge 21 and an adjacent valley 23 on the surface of the elongated, ductile, ridged, coil-retaining member 11. The amplitude 27 and period 25 of the sinusoid may vary based on the dimensions of the electric signal cable 5. The amplitude 27 of the sinusoid may be any value in the range of 0.1 mm to 10 mm and is designed to be 50% of the radius of the cable. The frequency of the sinusoid may be any value in the range of 0.1 to 10 cycles per millimeter, which corresponds to a period 25 in the range of 10 mm to 0.1 mm.

According to another aspect, the predetermined, repeating pattern of the ridges 21 and valleys 23 arranged on the surface of the elongated, ductile, ridged, coil-retaining member 11 may take the shape of a square wave of the form $$y(x) = \begin{cases} A, & 0 < |x| \le \frac{\tau}{2} \\ -A, & \frac{\tau}{2} < |x| \le \tau \end{cases},$$

where A is the amplitude 27 that specifies the height of the ridges 21 and depth of the valleys 23. The x specifies a distance from the second end of the cable. The r represents the period 25 of the triangle wave function. One period 25 corresponds to one ridge 21 and an adjacent valley 23 on the surface of the elongated, ductile, ridged, coil-retaining member 11. The amplitude 27 and period 25 of the sinusoid may vary based on the dimensions of the electric signal cable 5. The amplitude 27 of the sinusoid may be any value in the range of 0.1 mm to 10 mm and is designed to be 50% of the radius of the cable. The frequency of the sinusoid may be any value in the range of 0.1 to 10 cycles per millimeter, which corresponds to a period 25 in the range of 10 mm to 0.1 mm.

In an embodiment, the electric signal cable 5 is a cell phone charging cable with a radius of 1.5 mm, and the predetermined, repeating pattern on the surface of the elongated, ductile, ridged, coil-retaining member 11 is in the form of a sinusoid. The amplitude 27 of the sinusoid may be 0.75 mm, and the period of the sinusoid may be in the range of 0.9 mm to 5 mm. In an implementation where the dimensions of the electric signal cable 5 are larger than a cell phone charging cable, such as in the case of a computer power cord with a radius of 2.5 mm, the amplitude 27 of the sinusoid may be 1.25 mm and the period 25 of the sinusoid may be in the range of 3 mm to 8 mm.

Figure 4:
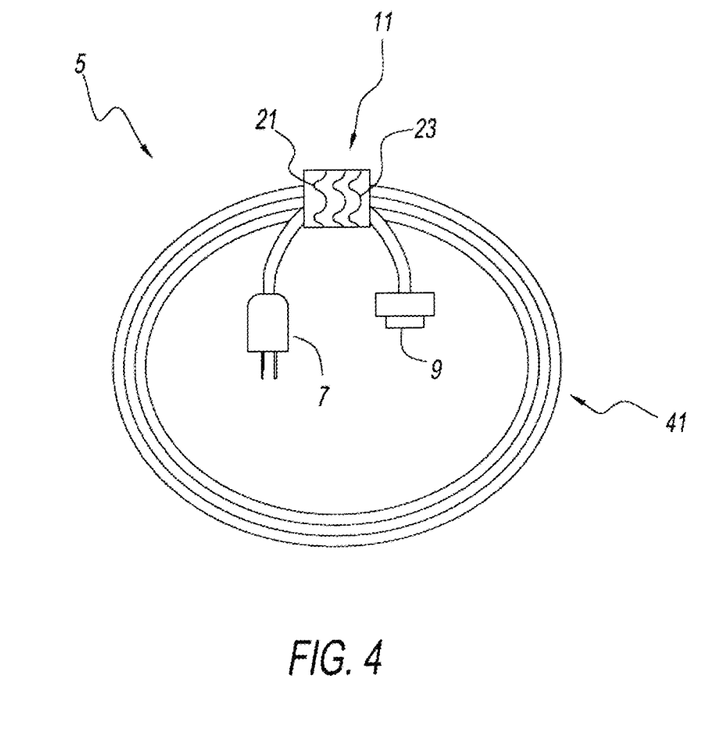
FIG. 4 is an exemplary illustration of an electric signal cable with an elongated, ductile, ridged, coil-retaining member in a wound state.

FIG. 4 is an exemplary illustration of an electric signal cable 5 with an elongated, ductile, ridged, coil-retaining member 11 in a wound state. In this illustration, a portion of the electric signal cable 5 nearest to the first end 7 is coiled into a predetermined number of loops 41 of the cable electric signal cable 5. The number of loops 41 that the electric signal cable 5 may be coiled into depends upon the length 29 of elongated, ductile, ridged, coil-retaining member. In some implementations, the electric signal cable 5 may be coiled into 2, 3, 4, or more loops 41.

Once the electric signal cable 5 is coiled into the predetermined number of loops 41, the portion of the electric signal cable 5 with the elongated, ductile, ridged, coil-retaining member 11 is wrapped around the loops 41 of the electric signal cable 5 to retain the cable in a wound state. The ridges 21 on the surface of the elongated, ductile, ridged, coil-retaining member 11 are positioned so that they fit within the valleys 23 on the surface of the elongated, ductile, ridged, coil-retaining member 11. Positioning the ridges 21 within the valleys 23 limits the translatory motion of the elongated, ductile, ridged, coil-retaining member 11 when it is subjected to a tensile stress.

Figure 5A:
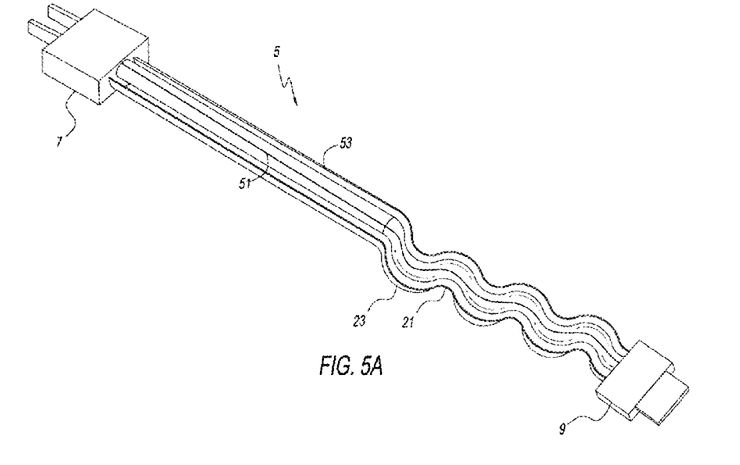
FIG. 5A is an exemplary illustration of a cross-section of an electric signal cable with an integral elongated, ductile, ridged, coil-retaining member.

FIG. 5A is an exemplary illustration of the cross-section of an electric signal cable 5 with an elongated, ductile, ridged, coil-retaining member 11 that is integral to the electric signal cable 5. A conducting wire 51 that carries electric signals is enclosed by an insulating material 53. The insulating material 53 may be composed of polyethylene, rubber, TEFLON, and the like. The elongated, ductile, ridged, coil-retaining member 11 is embedded between the conducting wire 51 and the insulating material 53 at the second end 9 of the electric signal cable 5. The elongated, ductile, ridged, coil-retaining member 11 is composed of a malleable material that is able to be bent into a shape by a user and then retains that shape until it is repositioned. A non-limiting list of suitable example materials includes metals such as aluminum, iron, or gold; metallic paper; plastic; smart metallic alloys; and malleable plastics such as malleable polymers, thermoplastics, and amorphous solids. There are a predetermined repeating pattern of ridges and valleys arranged on the surface of the elongated, ductile, ridged, coil-retaining member 11.

According to one embodiment, the elongated, ductile, ridged, coil-retaining member 11 is composed of two separate materials. A metallic material with ductile properties 31 is able to be bent into a shape by a user and retains its shape until it is repositioned. A non-limiting list of suitable example materials includes metals such as aluminum, iron, or gold. This ductile metallic material is coated with a plastic coating 33 such as polyurethane, thermoplastics, and other malleable polymers. This plastic coating may be molded into a predetermined pattern of ridges 21 and valleys 23.

Figure 5B:
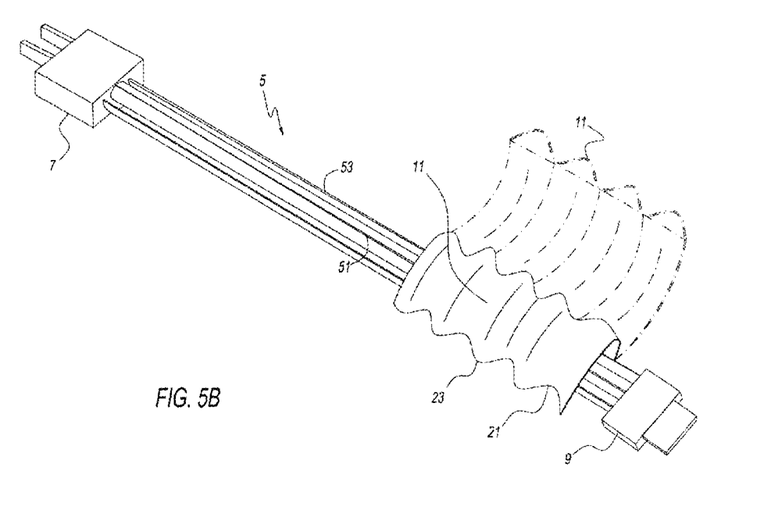
FIG. 5B is an exemplary illustration of a cross-section of an electric signal cable with a detachable elongated, ductile, ridged, coil-retaining member.

FIG. 5B is an exemplary illustration of the cross-section of an electric signal cable 5 with a detachable elongated, ductile, ridged, coil-retaining member 11. A conducting wire 51 that carries electric signals is enclosed by an insulating material 53. The insulating material 53 may be composed of polyethylene, rubber, TEFLON, and the like. The elongated, ductile, ridged, coil-retaining member 11 is detachably attached to the second end of the electric signal cable on the outside of the insulating material 53. When unattached, the elongated, ductile, ridged, coil-retaining member 11 is a piece of malleable material that resembles a rectangular shape that has been molded into a predetermined repeating pattern of ridges 21 and valleys 23. The elongated, ductile, ridged, coil-retaining member 11 is composed of a malleable material that is able to be bent into a shape by a user and then retains that shape until it is repositioned. A non-limiting list of suitable example materials includes metals such as aluminum, iron, or gold; metallic paper; plastic; smart metallic alloys; and malleable plastics such as malleable polymers, thermoplastics, and amorphous solids.

According to one embodiment, the elongated, ductile, ridged, coil-retaining member 11 is composed of two separate materials. A metallic material with ductile properties 31 is able to be bent into a shape by a user and retains its shape until it is repositioned. A non-limiting list of suitable example materials includes metals such as aluminum, iron, or gold. This ductile metallic material is coated with a plastic coating 33 such as polyurethane, thermoplastics, and other malleable polymers. This plastic coating may be molded into a predetermined pattern of ridges 21 and valleys 23.

To attach the elongated, ductile, ridged, coil-retaining member 11 to the electric signal cable 5, it is wrapped longitudinally around the second end of the cable 9. According to an implementation, the elongated, ductile, ridged, coil-retaining member 11 may be adhered to the surface of the electric signal cable 5 with an adhesive material such as tape or glue but may also be applied through a heat shrink process.

Figure 6A:
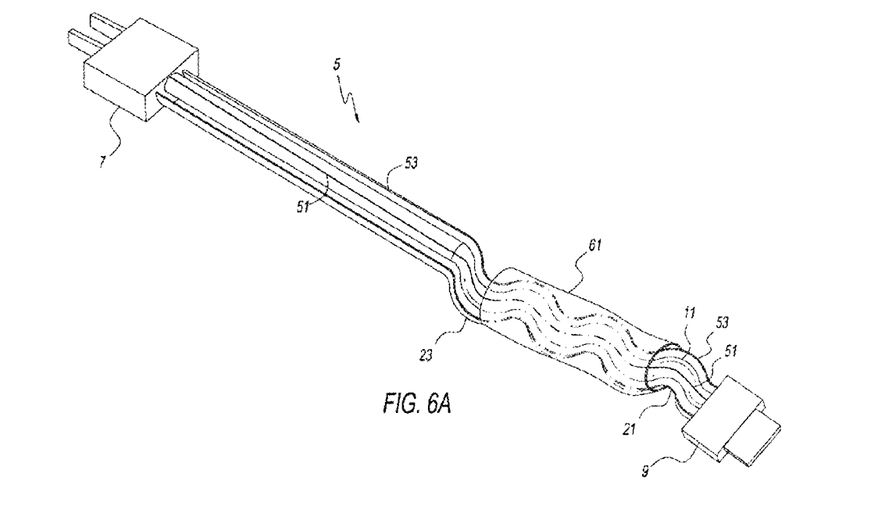
FIG. 6A is an exemplary illustration of the cross-section of an electric signal cable with an integral elongated, ductile, ridged, coil-retaining member and electromagnetic shielding.

FIG. 5A is an exemplary illustration of the cross-section of an electric signal cable 5 with an integral elongated, ductile, ridged, coil-retaining member 11 that includes an electromagnetic shielding material 61. The electromagnetic shielding material may be a foil, tape, fabric, paint, or any other material manufactured to isolate the electric signal cable 5 and the area in the immediate vicinity from electromagnetic radiation, which may also include radio frequency waves. According to an implementation, the elongated, ductile, ridged, coil-retaining member 11 is integral to the electric signal cable 5, and the electromagnetic shielding material 51 is manufactured as a part of the elongated, ductile, ridged, coil-retaining member 11. In this implementation, the electromagnetic shielding material 61 may be a paint with electromagnetic shielding properties that is applied directly to the elongated, ductile, ridged, coil-retaining member 11. The elongated, ductile, ridged, coil-retaining member 11 is embedded between the conducting wire 51 and the insulating material 53 at the second end 9 of the electric signal cable 5.

In one aspect, the electromagnetic shielding material 61 is a foil that is separate from the elongated, ductile, ridged, coil-retaining member 11. In this aspect, the electromagnetic shielding material 61 may be integral to the electric signal cable. The elongated, ductile, ridged, coil-retaining member 11 and the electromagnetic shielding material 61 are embedded between the conducting wire 51 and the insulating material 53 at the second end 9 of the electric signal cable 5. The electromagnetic shielding material 61 that is embedded within the electric signal cable 5 extends at least 3 cm in the axial direction from the second end 9 of the cable.

The electromagnetic shielding material 61 may also be applied on the exterior surface of the electric signal cable 5 with the integral elongated, ductile, ridged, coil-retaining member 11. According to this implementation, the electromagnetic shielding material 61 may be a foil or a tape with electromagnetic shielding properties that is wrapped longitudinally around the second end 9 of the electric signal cable 5 and extends at least 3 cm in the axial direction.

Figure 6B:
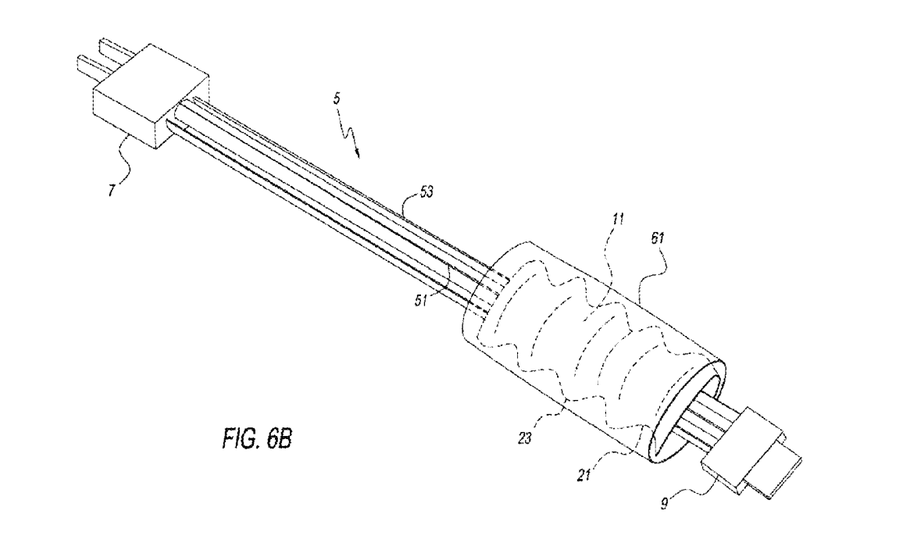
FIG. 6B is an exemplary illustration of the cross-section of an electric signal cable with a detachable elongated, ductile, ridged, coil-retaining member and electromagnetic shielding.

FIG. 5B is an exemplary illustration of the cross-section of an electric signal cable 5 with a detachable elongated, ductile, ridged, coil-retaining member 11 that includes an electromagnetic shielding material 61. A conducting wire 51 that carries electric signals is enclosed by an insulating material 53. The elongated, ductile, ridged, coil-retaining member 11 is detachably attached to the second end of the electric signal cable on the outside of the insulating material 53. When unattached, the elongated, ductile, ridged, coil-retaining member 11 is a piece of malleable material that resembles a rectangular shape that has been molded into a predetermined repeating pattern of ridges 21 and valleys 23. To attach the elongated, ductile, ridged, coil-retaining member 11 to the electric signal cable 5, it is wrapped longitudinally around the second end of the cable 9. According to an implementation, the elongated, ductile, ridged, coil-retaining member 11 may be adhered to the surface of the electric signal cable 5 with an adhesive material such as tape or glue but may also be applied through a heat shrink process.

The electromagnetic shielding material may be a foil, tape, fabric, paint, or any other material manufactured to isolate the electric signal cable 5 and the area in the immediate vicinity from electromagnetic radiation, which may also include radio frequency waves. According to one implementation, the electromagnetic shielding material 51 is manufactured as a part of the elongated, ductile, ridged, coil-retaining member 11. In this implementation, the electromagnetic shielding material 61 may be a paint with electromagnetic shielding properties that is applied directly to the elongated, ductile, ridged, coil-retaining member 11.

The electromagnetic shielding material 61 may also be applied on the exterior surface of the electric signal cable 5 with the detachable elongated, ductile, ridged, coil-retaining member 11. According to this implementation, the electromagnetic shielding material 61 may be a foil or a tape with electromagnetic shielding properties that is wrapped longitudinally around the second end 9 of the electric signal cable 5 and extends at least 3 cm in the axial direction.

As an alternative to shielding, the member 11 is made from a shape-retaining plastic material such as a strip with 1-way bend, part no 20682-01 available from INVENTABLES at www.inventables.com. Using a shape-retaining plastic as the member 11, avoids the issue of electrical current being induced in the member, and thus avoids any adverse effect on the electromagnetic waves that are imparted on the signal cable, thus destroying an intended effect of inducing a current into the signal wire (perhaps for sensor applications).

Figure 7:
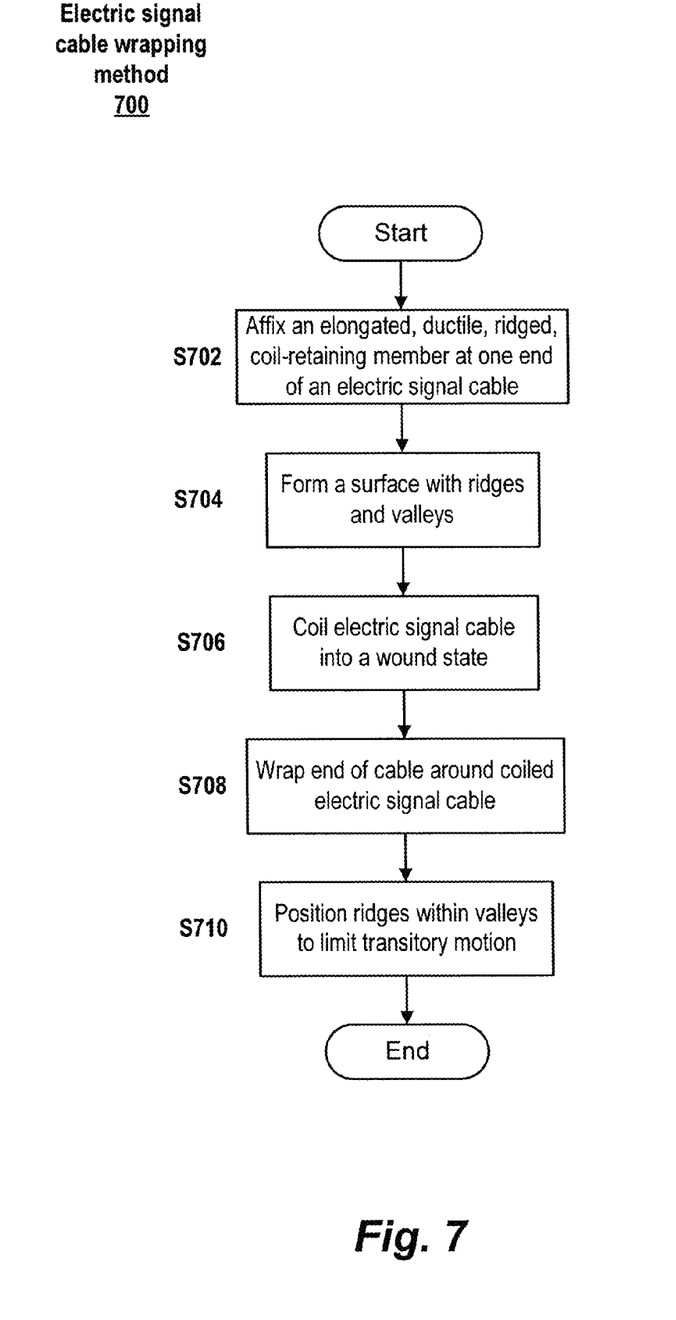
FIG. 7 is an exemplary flowchart of a method for retaining an electric signal cable in a wound state with an elongated, ductile, ridged, coil-retaining member.

FIG. 7 is an exemplary flowchart of a method for wrapping and retaining an electric signal cable 700. At step S702, an elongated, ductile, ridged, coil-retaining member 11 is affixed at one end of an electric signal cable 5. According to one implementation, the elongated, ductile, ridged, coil-retaining member 11 may be integral to the electric signal cable 5, which is embedded within the cable during the manufacturing process. A conducting wire 51 that carries electric signals is enclosed by an insulating material 53. The elongated, ductile, ridged, coil-retaining member 11 is embedded between the conducting wire 51 and the insulating material 53 at the second end 9 of the electric signal cable 5.

The elongated, ductile, ridged, coil-retaining member 11 may also be detachable from the electric signal cable 5 according to one aspect. A conducting wire 51 that carries electric signals is enclosed by an insulating material 53. The elongated, ductile, ridged, coil-retaining member 11 is detachably attached to the second end of the electric signal cable on the outside of the insulating material 53. To attach the elongated, ductile, ridged, coil-retaining member 11 to the electric signal cable 5, it is wrapped longitudinally around the second end of the cable 9. According to an implementation, the elongated, ductile, ridged, coil-retaining member 11 may be adhered to the surface of the electric signal cable 5 with an adhesive material such as tape or glue but may also be applied through a heat shrink process.

At step S704, a surface is formed on the elongated, ductile, ridged, coil-retaining member 11 with a predetermined pattern of ridges and valleys. According to one implementation, the pattern is a sinusoid is of the form $y(x) = A \sin(2\pi f x)$, where A is the amplitude 27 that specifies the height of the ridges 21 and depth of the valleys 23. The x specifies a distance from the second end of the cable. The frequency f of the sinusoidal pattern translates to a corresponding period 25 of the sinusoid according to the equation, $\tau = 1/f$, where $\tau$ represents the period 25 of the sinusoid. One period 25 corresponds to one ridge 21 and an adjacent valley 23 on the surface of the elongated, ductile, ridged, coil-retaining member 11. The amplitude 27 and period 25 of the sinusoid may vary based on the dimensions of the electric signal cable 5. The amplitude 27 of the sinusoid may be any value in the range of 0.1 mm to 10 mm and is designed to be 50% of the radius of the cable. The frequency of the sinusoid may be any value in the range of 0.1 to 10 cycles per millimeter, which corresponds to a period 25 in the range of 10 mm to 0.1 mm.

According to another aspect, the predetermined, repeating pattern of the ridges 21 and valleys 23 arranged on the surface of the elongated, ductile, ridged, coil-retaining member 11 may take the shape of a saw tooth wave of the form $$y(x) = A\frac{x}{\tau} - A\left\lfloor\frac{x}{\tau}\right\rfloor$$

where A is the amplitude 27 that specifies the height of the ridges 21 and depth of the valleys 23. The x specifies a distance from the second end of the cable. The $\tau$ represents the period 25 of the saw tooth function. One period 25 corresponds to one ridge 21 and an adjacent valley 23 on the surface of the elongated, ductile, ridged, coil-retaining member 11. The amplitude 27 and period 25 of the sinusoid may vary based on the dimensions of the electric signal cable 5. The amplitude 27 of the sinusoid may be any value in the range of 0.1 mm to 10 mm and is designed to be 50% of the radius of the cable. The frequency of the sinusoid may be any value in the range of 0.1 to 10 cycles per millimeter, which corresponds to a period 25 in the range of 10 mm to 0.1 mm.

According to another aspect, the predetermined, repeating pattern of the ridges 21 and valleys 23 arranged on the surface of the elongated, ductile, ridged, coil-retaining member 11 may take the shape of a triangle wave of the form $$y(x) = \left|A\frac{x}{\tau} - A\left\lfloor\frac{x}{\tau}\right\rfloor\right|$$

where A is the amplitude 27 that specifies the height of the ridges 21 and depth of the valleys 23. The x specifies a distance from the second end of the cable. The r represents the period 25 of the triangle wave function. One period 25 corresponds to one ridge 21 and an adjacent valley 23 on the surface of the elongated, ductile, ridged, coil-retaining member 11. The amplitude 27 and period 25 of the sinusoid may vary based on the dimensions of the electric signal cable 5. The amplitude 27 of the sinusoid may be any value in the range of 0.1 mm to 10 mm and is designed to be 50% of the radius of the cable. The frequency of the sinusoid may be any value in the range of 0.1 to 10 cycles per millimeter, which corresponds to a period 25 in the range of 10 mm to 0.1 mm.

According to another aspect, the predetermined, repeating pattern of the ridges 21 and valleys 23 arranged on the surface of the elongated, ductile, ridged, coil-retaining member 11 may take the shape of a square wave of the form $$y(x) = \begin{cases} A, & 0 < |x| \le \frac{\tau}{2} \\ -A, & \frac{\tau}{2} < |x| \le \tau \end{cases},$$

where A is the amplitude 27 that specifies the height of the ridges 21 and depth of the valleys 23. The x specifies a distance from the second end of the cable. The r represents the period 25 of the triangle wave function. One period 25 corresponds to one ridge 21 and an adjacent valley 23 on the surface of the elongated, ductile, ridged, coil-retaining member 11. The amplitude 27 and period 25 of the sinusoid may vary based on the dimensions of the electric signal cable 5. The amplitude 27 of the sinusoid may be any value in the range of 0.1 mm to 10 mm and is designed to be 50% of the radius of the cable. The frequency of the sinusoid may be any value in the range of 0.1 to 10 cycles per millimeter, which corresponds to a period 25 in the range of 10 mm to 0.1 mm.

At step S706, the electric signal cable 5 is coiled into loops so that it is in a wound state. A portion of the electric signal cable 5 nearest to the first end 7 of the cable is coiled into a predetermined number of loops 41. The number of loops 41 that the electric signal cable 5 may be coiled into depends upon the length 29 of elongated, ductile, ridged, coil-retaining member. In some implementations, the electric signal cable 5 may be coiled into 2, 3, 4, or more loops 41.

At step S608, once the electric signal cable 5 is coiled into the predetermined number of loops 41, the portion of the electric signal cable 5 with the elongated, ductile, ridged, coil-retaining member 11 is wrapped around the loops 41 of the electric signal cable 5. When the elongated, ductile, ridged, coil-retaining member 11 is wrapped around the loops 41, it retains the cable in a wound state.

At step S710, the ridges 21 on the surface of the elongated, ductile, ridged, coil-retaining member 11 are positioned within the valleys 23 on the surface of the elongated, ductile, ridged, coil-retaining member 11. Positioning the ridges within the valleys limits the translatory motion of the elongated, ductile, ridged, coil-retaining member 11 while it is retaining the loops 31 of the electric signal cable 5.

Obviously, numerous modifications and variations of the present advancements are possible in light of the above teachings. It is therefore to be understood that within the scope of the appended claims, the present advancements may be practiced otherwise than as specifically described herein.

The invention claimed is:

1. An electric signal cable, comprising:
    an insulated cable, including a plurality of insulated conductors, having a first interface at one end thereof configured to detachably attach to a first electronic device and a second interface at the other end thereof configured to detachably attach to a second electronic device so as to interconnect the first electronic device with the second electronic device; and
    an elongated, ductile, ridged, coil-retaining member disposed at the other end of the insulated cable, and configured to hold the electric signal cable in a wound state when the elongated, ductile, ridged, coil-retaining member is wrapped on itself such that ridges on a surface of a first part of the elongated, ductile, ridged, coil-retaining member are received by valleys in a second part of the elongated, ductile, ridged, coil-retaining member to limit a translatory motion of the elongated, ductile, ridged, coil-retaining member when subjected to a tensile stress,
    wherein the length of the elongated, ductile, ridged, coil-retaining member is an integer multiple of a diameter of the insulated cable times a number of loops of coiled cable that the elongated, ductile, ridged, coil-retaining member retains.

2. The electric signal cable of claim 1, wherein the ridges and the valleys on the surface of the elongated, ductile, ridged, coil-retaining member are arranged in a predetermined, repeating pattern.

3. The electric signal cable of claim 2, wherein the predetermined repeating pattern of the ridges and the valleys on the surface of the elongated, ductile, ridged, coil-retaining member is defined by $y(x) = A \sin(2\pi f x)$, where A is an amplitude, x is distance, and f is frequency.

4. The electric signal cable of claim 2, wherein the predetermined repeating pattern of the ridges and the valleys on the surface of the elongated, ductile, ridged, coil-retaining member is defined by $$y(x) = A\frac{x}{\tau} - A\left\lfloor\frac{x}{\tau}\right\rfloor,$$

where A is amplitude, x is distance, and $\tau$ is period.

5. The electric signal cable of claim 2, wherein the predetermined repeating pattern of the ridges and the valleys on the surface of the elongated, ductile, ridged, coil-retaining member is defined by $$y(x) = \left|A\frac{x}{\tau} - A\left\lfloor\frac{x}{\tau}\right\rfloor\right|,$$

where A is amplitude, x is distance, and $\tau$ is period.

6. The electric signal cable of claim 2, wherein the predetermined repeating pattern of the ridges and the valleys on the surface of the elongated, ductile, ridged, coil-retaining member is defined by $$y(x) = \begin{cases} A, & 0 < |x| \le \frac{\tau}{2} \\ -A, & \frac{\tau}{2} < |x| \le \tau \end{cases},$$

where A is amplitude, x is distance, and $\tau$ is period.

7. The electric signal cable of claim 6, wherein the amplitude is between 1 mm and 5 mm, and the frequency is between 0.1 to 10 cycles per mm, and the period is between 10 mm to 0.1 mm.

8. The electric signal cable of claim 7, wherein the amplitude is 50% of a radius of the insulated cable.

9. The electric signal cable of claim 1, wherein the elongated, ductile, ridged, coil-retaining member extends from the second end by between 2 cm and 5 cm.

10. The electrical signal cable of claim 1, wherein the elongated, ductile, ridged, coil-retaining member is integral to the electric cable.

11. The electric signal cable of claim 1, wherein the elongated, ductile, ridged, coil-retaining member is detachably attachable to the other end of the insulated cable and is attached when wrapped longitudinally around the other end of the insulated cable.

12. The electric signal cable of claim 1, wherein the elongated, ductile, ridged, coil-retaining member contains an electromagnetic shielding material that surrounds the other end of the insulated cable by at least 3 cm in an axial direction.

13. The electric signal cable of claim 12, wherein the elongated, ductile, ridged, coil-retaining member includes the electromagnetic shielding material.

14. The electric signal cable of claim 12, wherein the electromagnetic shielding material is integral to the insulated cable.

15. The electric signal cable of claim 12, wherein the electromagnetic shielding material is detachably attachable to the other end of the insulated cable and is attached when wrapped longitudinally around the other end of the insulated cable.

16. The electric signal cable of claim 12, wherein the electromagnetic shielding material is a foil.

17. A method of binding a coiled electric signal cable, comprising:
affixing an elongated, ductile, ridged, coil-retaining member at one end of an electric signal cable, a surface on the elongated, ductile, ridged, coil-retaining member having ridges and valleys formed thereon;
coiling the electric signal cable into a wound state to form a coiled electric signal cable;
wrapping the one end of the electric signal cable around the electric signal cable that is in the wound state; and
positioning the ridges within the valleys on the surface of the elongated, ductile, ridged, coil-retaining member to limit translatory motion,
wherein the length of the elongated, ductile, ridged, coil-retaining member is an integer multiple of a diameter of the insulated cable times a number of loops of coiled cable that the elongated, ductile, ridged, coil-retaining member retains.

18. The electric signal cable of claim 1, wherein the elongated, ductile, ridged, coil-retaining member disposed at the other end of the insulated cable is bendable to a degree such that it can be completely overlayed on itself.

19. An electric signal cable, comprising:
an insulated cable, including a plurality of insulated conductors, having a first interface at one end thereof configured to detachably attach to a first electronic device and a second interface at the other end thereof configured to detachably attach to a second electronic device so as to interconnect the first electronic device with the second electronic device; and
an elongated, ductile, ridged, coil-retaining member disposed at the other end of the insulated cable, and configured to hold the electric signal cable in a wound state when the elongated, ductile, ridged, coil-retaining member is wrapped on itself such that ridges on a surface of a first part of the elongated, ductile, ridged, coil-retaining member are received by valleys in a second part of the elongated, ductile, ridged, coil-retaining member to limit a translatory motion of the elongated, ductile, ridged, coil-retaining member when subjected to a tensile stress,
wherein the length of the elongated, ductile, ridged, coil-retaining member is an integer multiple of a diameter of the insulated cable times a number of loops of coiled cable that the elongated, ductile, ridged, coil-retaining member retains,
wherein the elongated, ductile, ridged, coil-retaining member is detachably attachable to the other end of the insulated cable in a longitudinal direction for the length of the elongated, ductile, ridged, coil-retaining member, and
wherein the elongated, ductile, ridged, coil-retaining member contains an electromagnetic shielding material that surrounds the other end of the insulated cable by at least 3 cm in an axial direction.

\* \* \* \* \*